(12) United States Patent
Campbell et al.

(10) Patent No.: US 9,462,729 B1
(45) Date of Patent: Oct. 4, 2016

(54) TILE ASSEMBLIES FACILIATING FAILOVER AIRFLOW INTO COLD AIR CONTAINMENT AISLE

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/955,275

(22) Filed: Dec. 1, 2015

(51) Int. Cl.
  *E04B 1/70* (2006.01)
  *E04F 17/00* (2006.01)
  *H05K 7/20* (2006.01)
  *F24F 11/00* (2006.01)

(52) U.S. Cl.
  CPC ...... *H05K 7/20745* (2013.01); *H05K 7/20727* (2013.01); *H05K 7/20736* (2013.01); *H05K 7/20836* (2013.01); *F24F 2011/0002* (2013.01); *F24F 2011/0006* (2013.01)

(58) Field of Classification Search
  CPC ............ H05K 7/20745; H05K 7/20727; H05K 7/20736; H05K 7/20836; F24F 11/0001
  See application file for complete search history.

(56) References Cited

U.S. PATENT DOCUMENTS

| | | | |
|---|---|---|---|
| 5,793,610 A | 8/1998 | Schmitt et al. | |
| 6,042,348 A * | 3/2000 | Aakalu | F04D 25/14 361/695 |
| 6,174,232 B1 | 1/2001 | Stoll et al. | |
| 6,705,833 B2 | 3/2004 | Tam et al. | |
| 7,416,481 B2 | 8/2008 | Baker et al. | |
| 7,800,902 B2 | 9/2010 | Della Fiora et al. | |
| 8,482,917 B2 | 7/2013 | Rose et al. | |
| 8,897,009 B2 | 11/2014 | Janes et al. | |
| 2002/0055329 A1* | 5/2002 | Storck | F24F 7/06 454/186 |
| 2009/0014397 A1* | 1/2009 | Moss | G06F 1/20 211/26.2 |
| 2010/0067193 A1* | 3/2010 | Arimilli | H05K 7/20809 361/679.47 |
| 2012/0009862 A1* | 1/2012 | Meyer | H05K 7/20745 454/184 |
| 2012/0024502 A1* | 2/2012 | Khalifa | H05K 7/20745 165/104.33 |

(Continued)

FOREIGN PATENT DOCUMENTS

JP  5399835 B2  1/2014
JP  549267 B2  3/2014

*Primary Examiner* — Brian Mattei
(74) *Attorney, Agent, or Firm* — Steven Chiu, Esq.; Kevin P. Radigan, Esq.; Heslin Rothenberg Farley & Mesiti P.C.

(57) ABSTRACT

Tile assemblies are provided having first and second tile sections and an airflow control mechanism. The first tile section allows, in a cold air cooling mode, cold air from a cold air plenum of a data center to flow into a cold air containment aisle for supply to an electronics rack(s). The second tile section is associated with the first tile section to allow, in a failover cooling mode, ambient air external the cold air plenum to flow, via an air pathway through the second and first tile sections into the containment aisle. The airflow control mechanism is disposed within the air pathway to block cold air from the cold air plenum from passing through the second tile section in the cold air cooling mode, and to allow, in the failover cooling mode, ambient air to pass through the air pathway into the cold air containment aisle.

20 Claims, 16 Drawing Sheets

(56) References Cited

U.S. PATENT DOCUMENTS

| | | | |
|---|---|---|---|
| 2012/0073840 A1* | 3/2012 | Prieur | A62C 2/10 169/46 |
| 2013/0091867 A1* | 4/2013 | Campbell | H05K 7/20809 62/3.2 |
| 2013/0273825 A1* | 10/2013 | Uno | H05K 7/20745 454/184 |
| 2013/0340535 A1* | 12/2013 | Sano | G01F 1/00 73/861.42 |
| 2015/0156925 A1* | 6/2015 | Chang | H05K 7/20836 165/287 |
| 2015/0359145 A1* | 12/2015 | Zhang | H05K 7/20745 361/679.47 |
| 2015/0382513 A1* | 12/2015 | Zhang | H05K 7/20745 361/679.5 |

* cited by examiner

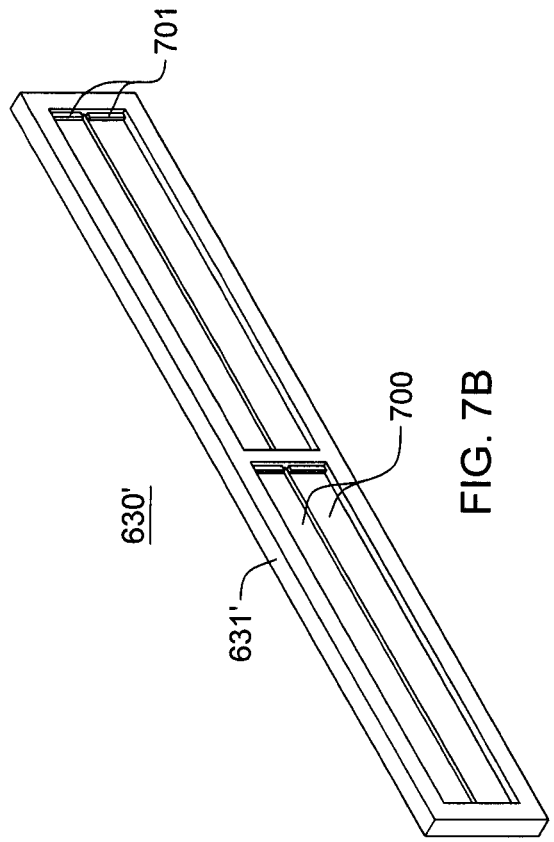
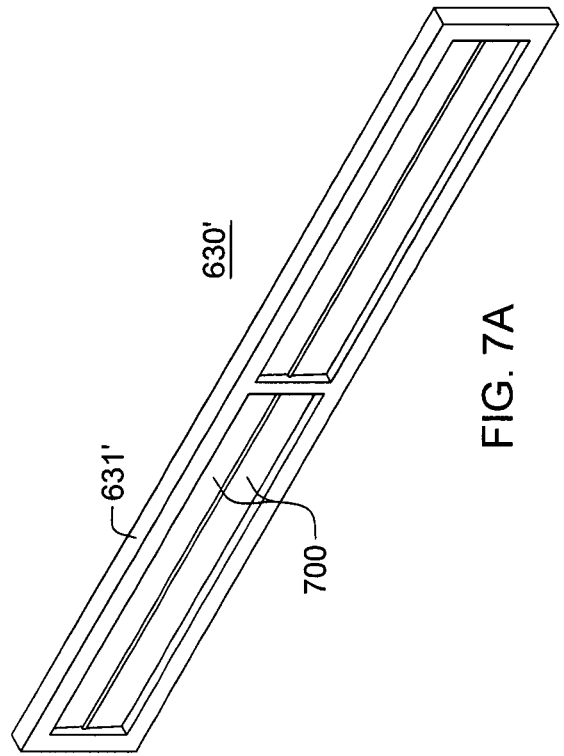

TILE ASSEMBLIES FACILIATING FAILOVER AIRFLOW INTO COLD AIR CONTAINMENT AISLE

BACKGROUND

In many server applications, processors, along with their associated electronics (e.g., memory, disk drives, power supplies, etc.), are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack(s), including the electronic subsystems thereof. As one solution, cooling apparatuses may be provided which include one or more air-moving assemblies (e.g., axial fans, centrifugal fans) which facilitate moving airflow through the electronics racks, typically front-to-back. These fans are in addition to the computer-room, air-moving assemblies, such as computer-room air-conditioner (CRAC) units or computer-room air-handler (CRAH) units, which provide air movement within the data center, and thus, cooling to the data center. To meet the ever-growing need for providing continuous cooling to the electronics racks of a data center, further air-distribution enhancements are needed.

SUMMARY

The shortcomings of the prior art and additional advantages are provided through the provision, in one aspect, of an apparatus which includes a tile assembly for a data center. The tile assembly comprises: a first tile section to allow, in a cold air cooling mode, cold air from a cold air plenum of the data center to flow through the first tile section to a cold air containment aisle of the data center for supply to one or more electronics racks drawing air from the cold air containment aisle; a second tile section associated with the first tile section to allow, in a failover cooling mode, ambient air of the data center external to the cold air plenum to flow, via an air pathway through the second tile section and the first tile section, into the cold air containment aisle; and an airflow control mechanism disposed within the air pathway to block cold air from the cold air plenum from passing through the second tile section into the data center in the cold air cooling mode, and to allow, in the failover cooling mode, ambient air from the data center to pass through the air pathway into the cold air containment aisle for supply to the one or more electronics racks.

In another aspect, a data center is provided which includes at least one electronics rack to be cooled, and a tile assembly. The at least one electronics rack draws air from a cold air containment aisle of the data center, and the tile assembly includes: a first tile section to allow, in a cold air cooling mode, cold air from a cold air plenum of the data center to flow through the first tile section to the cold air containment aisle for supply to the at least one electronics rack; a second tile section associated with the first tile section to allow, in a failover cooling mode, ambient air of the data center external to the cold air plenum to flow, via an air pathway through the second tile section and the first tile section, into the cold air containment aisle; and an airflow control mechanism disposed within the air pathway to block cold air from the cold air plenum from passing through the second tile section into the data center in the cold air cooling mode, and to allow, in the failover cooling mode, ambient air of the data center to pass through the air pathway into the cold air containment aisle for supply to the at least one electronics rack.

In a further aspect, a method of facilitating cooling is provided which includes providing a tile assembly for a data center comprising at least one electronics rack to be cooled. The providing of the tile assembly includes: providing a first tile section to allow, in a cold air cooling mode, cold air from a cold air plenum of the data center to flow through the first tile section to a cold air containment aisle of the data center for supply to the at least one electronics rack, which is disposed to draw air from the cold air containment aisle; providing a second tile section associated with the first tile section to allow, in a failover cooling mode, ambient air from the data center external to the cold air plenum to flow, via an air pathway through the second tile section and the first tile section, into the cold air containment aisle; and providing an airflow control mechanism disposed within the air pathway to block cold air from the cold air plenum from passing through the second tile section into the data center in the cold air cooling mode, and to allow, in the failover cooling mode, ambient air from the data center to pass through the air pathway into the cold air containment aisle for supply to the one or more electronics racks.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A depicts an alternate embodiment of an airflow control mechanism comprising a support bar with integral louvers for use in a tile assembly such as depicted in FIGS. 5A-6C, in accordance with one or more aspects of the present invention;

FIG. 7B depicts an opposite side view of the support bar with integral louvers of FIG. 7A, in accordance with one or more aspects of the present invention;

DETAILED DESCRIPTION

As used herein, the terms "electronics rack" and "rack unit" are used interchangeably, and unless otherwise specified include any housing, frame, rack, compartment, blade server system, etc., having one or more heat generating components of a computer system, electronic system, or information technology (IT) system, and may be, for example, a stand-alone computer processor having high, mid or low end processing capability. In one embodiment, an electronics rack may include one or more electronic systems or subsystems, each having one or more heat generating components requiring cooling. An electronic system or subsystem of an electronics rack may be movable or fixed relative to the electronics rack, with the electronics drawers of a multi-drawer rack unit and blades of a blade center system being two examples of systems or subsystems of an electronics rack to be cooled. In one specific example, "electronic subsystem" may refer to a part of an electronic system, and may be, in one example, a server node of a multi-server rack. Further, "data center" comprises to a computer or information technology (IT) installation containing one or more electronic systems, electronics racks, etc., to be cooled. As a specific example, a data center may include one or more rows of rack-mounted computing units, such as server units.

Reference is made below to the drawings, where the same reference numbers used throughout different figures designate the same or similar components.

Figure 1:
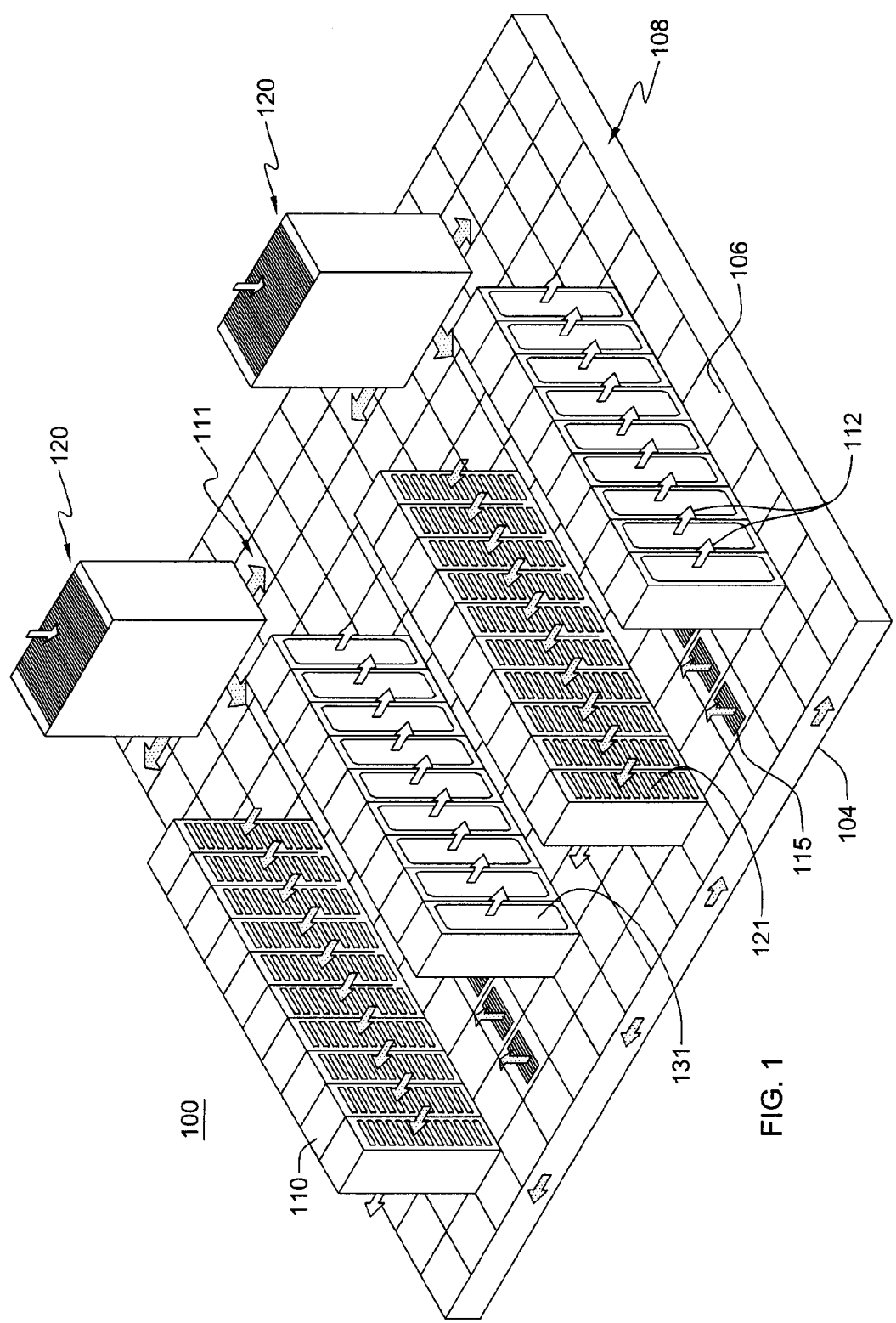
FIG. 1 depicts one embodiment of a data center or computer-room having a plurality of electronics racks to be air-cooled, in accordance with one or more aspects of the present invention.

FIG. 1 depicts one embodiment of a data center 100, which in one example, is a raised floor layout of an air-cooled computer installation or data center 100. Data center 100 includes electronics (or information technology (IT)) racks 110 disposed in one or more rows on a raised floor 106 of data center 100. One or more computer room air-handling units (CRAHs) 120 (also referred to as computer room air-conditioners (CRACs), which comprise one or more air-to-liquid heat exchangers) take in hot air, for example, through one or more air inlet vents in the top of the CRAHs, and exhaust cold air into a sub-floor plenum 108 below raised floor 106. Hot airflow within data center 100 is depicted by light arrows 112, and cold airflow within data center 100 is indicated by stippled arrows 111.

In FIG. 1, electronics racks 110 employ a front-to-back cooling approach. Namely, according to this approach, cold air 111 is drawn in through a front or air-inlet side 121 of each rack, and hot air 112 is exhausted from a back or air-outlet side 131 of each rack. The cold air drawn into the front of the rack is supplied to air inlets of the electronic components (e.g., servers) disposed within the IT racks. Space between raised floor 106 and a sub-floor 104 defines the sub-floor plenum 108. Sub-floor or cold air plenum 108 serves as a conduit to transport, for example, cold air 111 from the air-conditioning unit(s) 120 to the electronics racks 110. In one embodiment, electronics racks 110 are arranged in a hot aisle/cold aisle configuration, with their air-inlet sides and air-outlet sides disposed in alternating directions, as illustrated in FIG. 1. Cold air 111 is provided through one or more perforated floor tiles 115 in raised floor 106 from cold air plenum 108 into the cold aisles of the data center. The cold air 111 is then drawn into electronics rack 110, via their inlets, and subsequently exhausted into the data center as hot air via one or more air outlets of the individual electronics racks into the hot aisles of the data center.

Figure 2:
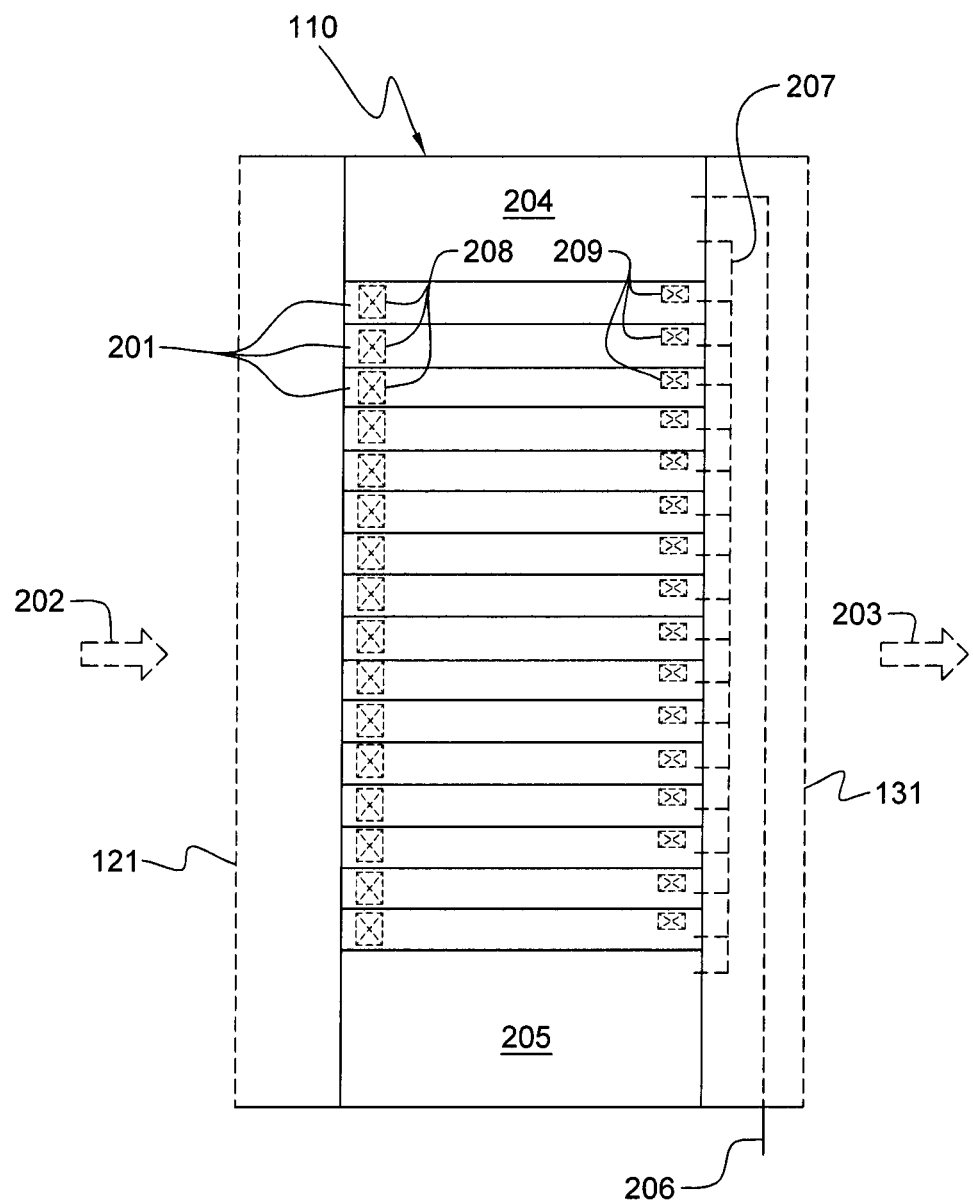
FIG. 2 is a cross-sectional elevational view of one embodiment of an electronics rack of the data center of FIG. 1 being air cooled, in accordance with one or more aspects of the present invention.

FIG. 2 depicts (by way of example) one embodiment of an electronics rack 110 with a plurality of electronic subsystems 201 to be cooled. In the embodiment illustrated, electronic subsystems 201 are air-cooled by cold airflow 202 ingressing via air inlet side 121, and exhausting out air outlet side 131 as hot airflow 203. By way of example, one or more axial fan assemblies 208 may be provided at the air inlet sides of electronic subsystems 201 and/or one or more centrifugal fan assemblies 209 may be provided at the air outlet sides of electronic subsystems 201 to facilitate airflow through the individual subsystems 201 as part of the cooling apparatus of electronics rack 110. One or more of electronic subsystems 201 may include heat-generating components to be cooled of a computer system, electronics system, and/or information technology (IT) equipment. For example, one or more of the electronic subsystems 201 may include one or more processors and associated memory.

Electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic subsystems 201. Also illustrated in FIG. 2 is one or more input/output (I/O) drawer(s) 205, which may also include a switch network. I/O drawer(s) 205 may include, as one example, PCI slots and disk driver for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic subsystems 201 and I/O drawer(s) 205. The number of electronic subsystems installed in the electronics rack is variable, and depends on customer requirements for a particular system. Further, axial or centrifugal fan assemblies could alternatively, or also, reside within, for instance, bulk power assembly 204, or I/O drawer(s) 205. Again, the particular electronics rack 110 configuration of FIG. 2 is presented by way of example only, and not by way of limitation.

Due, in part, to the ever-increasing airflow requirements to electronics racks, and limits of air distribution within the typical computer room installation, recirculation problems within the room may occur. For instance, in a conventional raised floor layout, hot air recirculation may occur from the air-outlet sides of the electronics rack back to the cold air aisle defined by the opposing air-inlet sides of the electronics racks. This recirculation can occur because the conditioned air supplied through the floor tiles may be less than the total airflow forced through the electronics racks by the air-moving devices disposed within the racks. This may be due, for example, to limitations on tile sizes (or diffuser flow rates). The remaining fraction of the supply of inlet-side air may be made of ambient room air through recirculation. This recirculating flow is often very complex in nature, and can lead to significantly higher rack unit inlet temperatures than might be expected.

Recirculation of hot air from the hot air aisle of the computer room installation to the cold air aisle can be detrimental to the performance and reliability of the computer system(s) or electronic system(s) within the rack(s). Typically, data center equipment has been designed to operate with rack air-inlet temperatures in the 15-35° C. range. For a raised floor layout such as depicted in FIG. 1, temperature can range from 15-20° C. at the lower portion of the rack, close to the cold airflow vents, to as much as 32-42° C. at the upper portion of the electronics racks, where hot air can form a self-sustaining recirculation loop. Since the allowable rack heat load is limited by the rack inlet-air temperature at the "hot" part, this temperature distribution correlates to an inefficient utilization of available air-conditioning capability. Computer installation equipment almost always represents a high capital investment to the customer. Thus, it is of significant importance, from a product reliability and performance viewpoint, and from a customer satisfaction and business perspective, to achieve a substantially uniform temperature across the air-inlet side of the rack unit.

Figure 3:
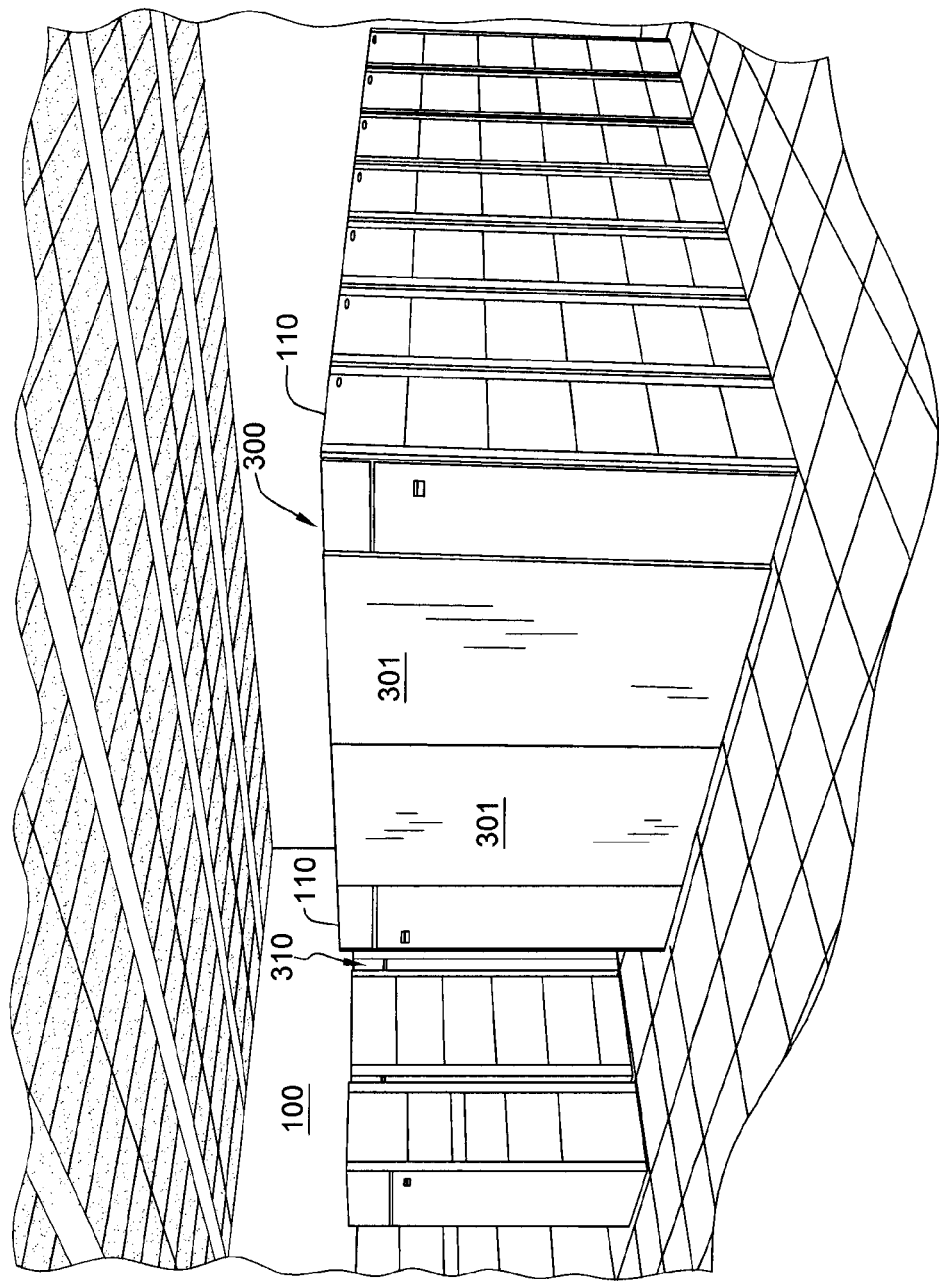
FIG. 3 depicts one embodiment of a data center or computer room having a plurality of electronics racks air cooled via a cold air containment aisle with one or more tile assemblies, in accordance with one or more aspects of the present invention.

FIG. 3 illustrates in greater detail one embodiment of raised floor data center 100 of FIG. 1. As depicted in FIG. 3, the electronics racks 110 may be arranged in rows to provide alternating cold air aisles 300 and hot air aisles 310, with the air inlet sides and air outlet sides of the electronics racks disposed in alternating directions, as illustrated in FIG. 1. In this example, cold air aisle(s) 300 is enclosed as a cold air containment aisle using one or more panels 301 at the ends of the aisle, along with top panels (not shown) over the aisle so as to form a contained region of cold air within the aisle, referred to herein as cold air containment aisle 300. The panels 301, as well as the top panels, advantageously contain the cold air being drawn from the cold air plenum for supply to the air inlet sides of the electronics racks, preventing hot air re-circulation from the hot air aisle of the data center to the cold air aisle, for instance, around the ends of the racks, or over the top of the racks. Note that in the illustrated example, each panel 301 may be sized and configured to substantially correspond in height and width to the height and width of the side of a respective electronics rack 110. If desired, panels 301 may be mounted via respective attachment mechanisms to the adjoining electronics racks 110 to be slidable between retracted positions and extended positions. In the retracted position, each panel 301 may reside along the side of the respective electronics rack 110. In this position, personnel are able to access the cold air aisle of the data center. In the extended position shown in FIG. 3, the warmer ambient air of the data center, including any hot air re-circulation from the hot air aisle(s), is blocked from reaching the cold air aisle.

As noted above in connection with FIG. 1, data center 100 further includes, for instance, one or more computer room air-conditioner (CRAC) units. In one or more implementations, the CRAC unit(s) may have a top-to-bottom airflow design, and be configured to provide temperature-conditioned air for electronics rack cooling in a data center, such as depicted in FIGS. 1 & 3. In operation, warm computer room air may enter a CRAC unit by an open vent at an air inlet of the CRAC unit, and optionally flow through a set of air filters before being passed across one or more air-to-liquid heat exchangers. Coolant may be provided to the air-to-liquid heat exchanger(s) via a coolant supply line and a coolant return line, with air being drawn across the heat exchanger via one or more mechanical fans (e.g., axial or centrifugal fans) disposed, for instance, in a lower portion of the CRAC unit. Cold air is pushed by the mechanical fans into, for instance, the underfloor plenum of the data center to create a pressurized cold air plenum needed to facilitate raised floor data center cooling via perforated tiles, such as discussed above with reference to FIG. 1. The air-to-coolant heat exchanger may be supplied (in one example) with chilled coolant from a refrigeration chiller. This chilled coolant absorbs heat from the warm air passing across the air-to-liquid heat exchanger, and rejects the heat to the refrigeration chiller plant.

In order to provide continuous operation of an electronics rack(s), the electronics rack(s) may be provided with an Uninterruptable Power Supply (UPS) system, which maintains operation of the electronic system(s) within the rack(s) in the event of a utility power disruption to the data center. When utility power is lost to a data center, the air-moving assemblies, such as computer-room air-conditioner (CRAC) units or computer-room air-handler (CRAH) units, typically lose power as well until the utility power is restored, or back-up generators become operational. Conventionally, it has been unnecessary to have the computer-room, air-moving assemblies on a UPS system, due to a relatively large cooling margin between the actual data center environmental operating conditions, and the point where the electronics rack(s), or more specifically the electronic system(s) or information technology (IT) and/or equipment within the electronics rack(s), could overheat, automatically throttle or shut down, and/or possibly become damaged. With greater emphasis on energy efficiency within a data center, however, the allowable environmental operating temperatures have risen, thus reducing the amount of time that a data center cooling apparatus or system can be interrupted without negatively affecting the electronics.

As a solution, an Uninterruptable Power Supply (UPS) system could be installed for the one or more computer-room, air-moving assemblies within the data center. However, this would require significant initial capital investment, as well as generating significant ongoing maintenance expenses. Further, installing UPS systems for computer-room, air-moving assemblies on a typical data center floor could require a sizable amount of floor or building space, due to the system's relatively large size.

During the design of electronics equipment, manufacturers often assume a zero external static pressure condition to select the appropriate air-moving devices. The computer room air-conditioner, or more generally, computer room air-handler (CRAH) fans are used in normal operation to drive the airflow through the data center, under the floor plenum, and through the perforated tiles, into the cold air aisle. The introduction of cold air containment imposes conditions on the data center. For instance, the CRAH unit(s) must supply 100% of the cold air through the perforated tiles that the electronics racks require. The electronics racks can no longer draw air from the data center space if insufficient air is supplied through the perforated tiles. Further, the introduction of aisle containment structures applies an additional static pressure loss on the data center airflow network.

In the event of a cooling failure, the loss of the CRAH air-moving assemblies in a traditional data center is muted by the electronics racks having a large capacity of data center air to draw from. However, when cold air containment aisles are introduced, as depicted in FIG. 3, the electronics equipment can no longer draw air directly from the data center. Instead, the electronics racks' air-moving devices must draw air through the CRAH heat exchanger and filter, the underfloor plenum, and the perforated tiles, into the cold air containment aisle, and then into and through the electronics racks. This introduces a significant resistance path that most electronics rack fans cannot adequately meet. Thus, the electronics racks would not have the required airflow, and risk being damaged due to overheating.

Figure 4:
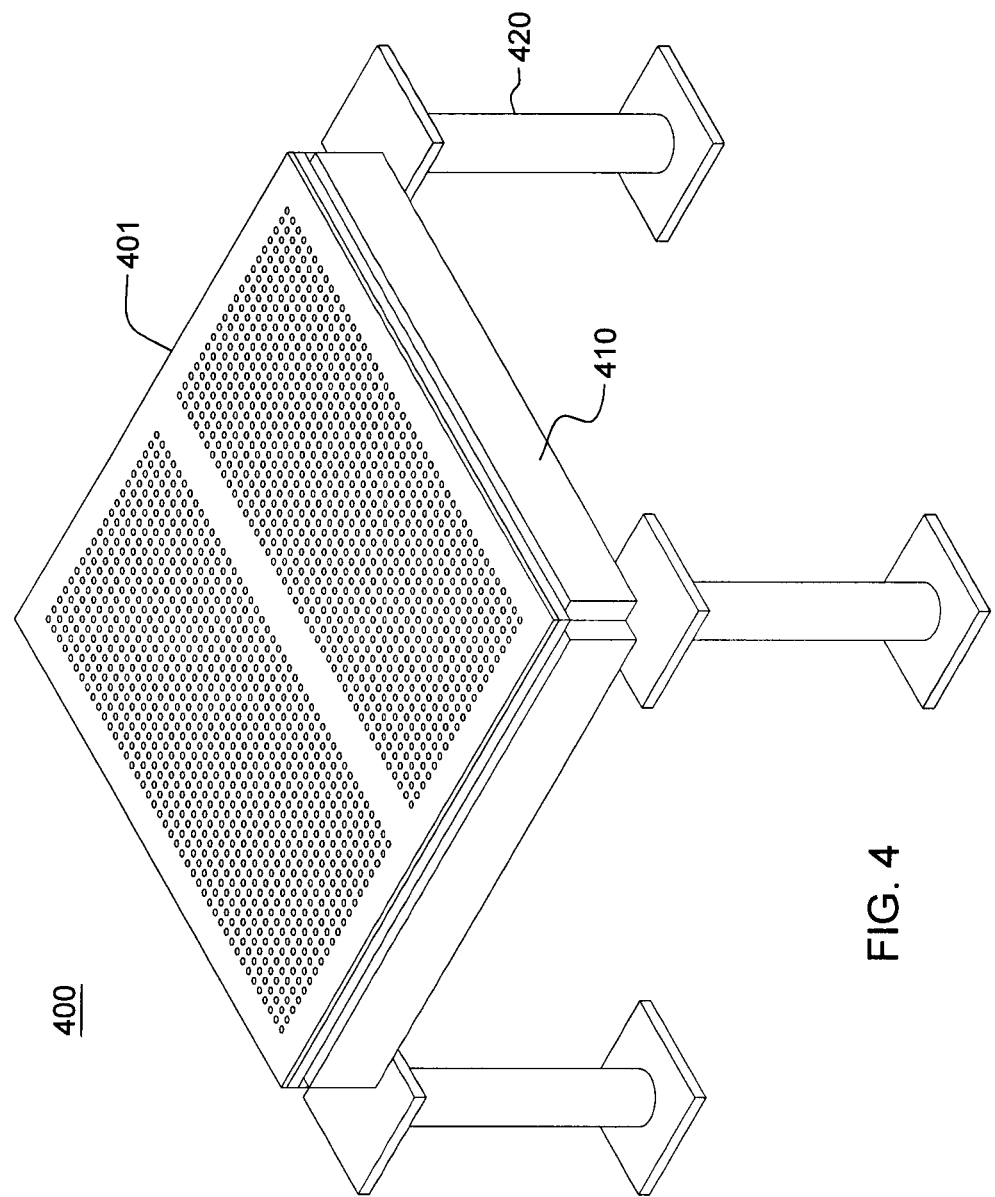
FIG. 4 is an isometric view of one embodiment of a conventional raised floor data center tile structure.

By way of example, FIG. 4 depicts one embodiment of a typical raised floor data center tile structure, generally denoted 400. The raised floor of the data center may include any desired number of tile structures 400 arrayed, for instance, in the one or more cold air aisles of the data center. These tile structures typically include a perforated cover 401 and a lower damper structure (not shown), below perforated cover 401. The tile structure 400 comprises, or is disposed on, a series of support bars 410 disposed on underfloor stanchions 420. Tile structures 400 are typically removable, and can be replaced within the data center.

Depending on the perforations of the perforated cover 401, and the lower damper structure design, a significant resistance may exist between, for instance, the underfloor plenum and the cold air aisle. In the event of loss of cold air pressure into the cold air plenum, for instance, due to loss of power to the computer room air-conditioning unit(s), the air-moving devices within the electronics racks would need to draw air through this high-resistance path in a cold air containment aisle configuration. Thus, it would be desirable to enable the electronics racks to draw ambient air from the data center volume itself when air-cooling is lost within the data center. Disclosed herein are tile assemblies which provide such a low-resistance airflow path in, for instance, a failover cooling mode of the air-cooled data center.

Generally stated, disclosed herein are apparatuses, data centers, and methods which facilitate air-cooling of one or more electronics racks within a data center. The apparatus includes a tile assembly comprising a first tile section, a second tile section, and an airflow control mechanism. The first tile section allows, in a cold air cooling mode, cold air from the cold air plenum of the data center to flow through the first tile section into a cold air containment aisle of the data center for supply to one or more electronics racks drawing air from the cold air containment aisle. The second tile section, which is associated with the first tile section, allows in a failover cooling mode, ambient air of the data center external to the cold air plenum to flow, via an air pathway through the second tile section and the first tile section, into the cold air containment aisle. The airflow control mechanism is disposed within the airflow pathway of the tile assembly to block cold air from the cold air plenum from passing through the section tile section into the data center in the cold air cooling mode, and allow, in the failover cooling mode, ambient air of the data center to pass through the air pathway into the cold air containment aisle for supply to the one or more electronics racks.

The tile assembly is sized to allow the first tile section to reside, at least in part, within the cold air containment aisle, and the second tile section to reside, at least in part, external to the cold air containment aisle. The air pathway through the second tile section and the first tile section in the failover cooling mode is a low-pressure air pathway, and in the cold air cooling mode, cold air flows from the cold air plenum via a high-pressure air pathway through, in part, the first tile section into the cold air containment aisle. The high-pressure pathway has greater airflow resistance than the low-pressure pathway.

Numerous configurations of the tile assembly are described and depicted herein. For instance, the airflow control mechanism may include at least one airflow diode or louver. In one or more implementations, the airflow control mechanism may be a passive mechanism which automatically opens to allow the ambient air from the data center to pass through the air pathway in the failover cooling mode based on a drop in cold air pressure at the first tile section. In one or more embodiments, the air pathway may be through an opening in a support bar of, or associated with, the tile assembly. Further, the airflow control mechanism may be disposed, at least in part, within the opening in the support bar, and the support bar may be positioned between the first tile section and the second tile section. In one or more implementations, the second tile section may be larger than the first tile section. For instance, the second tile section may include a greater number of tiles than the first tile section.

In one or more embodiments, the first tile section and the second tile section may be different portions of a common tile structure. The first tile section may include a first set of perforations through which air passes into the cold air containment aisle in both the cold air cooling mode and the failover cooling mode, and the second tile section may include a second set of perforations through which ambient air from the data center enters the air pathway of the tile assembly in the failover cooling mode. By way of example, the first set of perforations may be different in at least one of quantity or size from the second set of perforations. In one or more implementations, the first set of perforations may be exposed within the cold air aisle of the data center, and the second set of perforations may reside outside of the contained cold air aisle of the data center. In one or more embodiments, the first tile section may be in fluid communication with the cold air plenum via one or more openings in a base of a common tile structure. The one or more openings in the base facilitate, in the cold air cooling mode, the flow of cold air from the cold air plenum through the first tile section into the cold air containment aisle.

FIGS. 5A-5E depict one embodiment of a data center 100 tile assembly, generally denoted 500, in accordance with one or more aspects of the present invention. As depicted, tile assembly 500 comprises, in one or more implementations, a common tile structure having a first tile section 510, second tile section 520, and an airflow control mechanism 530.

In one or more embodiments, tile assembly 500 may be positioned so that first tile section 510 resides in, or is exposed to, cold air containment aisle 300 of data center 100, and second tile section 520 resides, at least in part, external to cold air containment aisle 300. As noted above, cold air containment aisle 300 may be formed using one or more containment panels 301 disposed, for instance, at the end of a cold air aisle of data center 100.

Figure 5A:
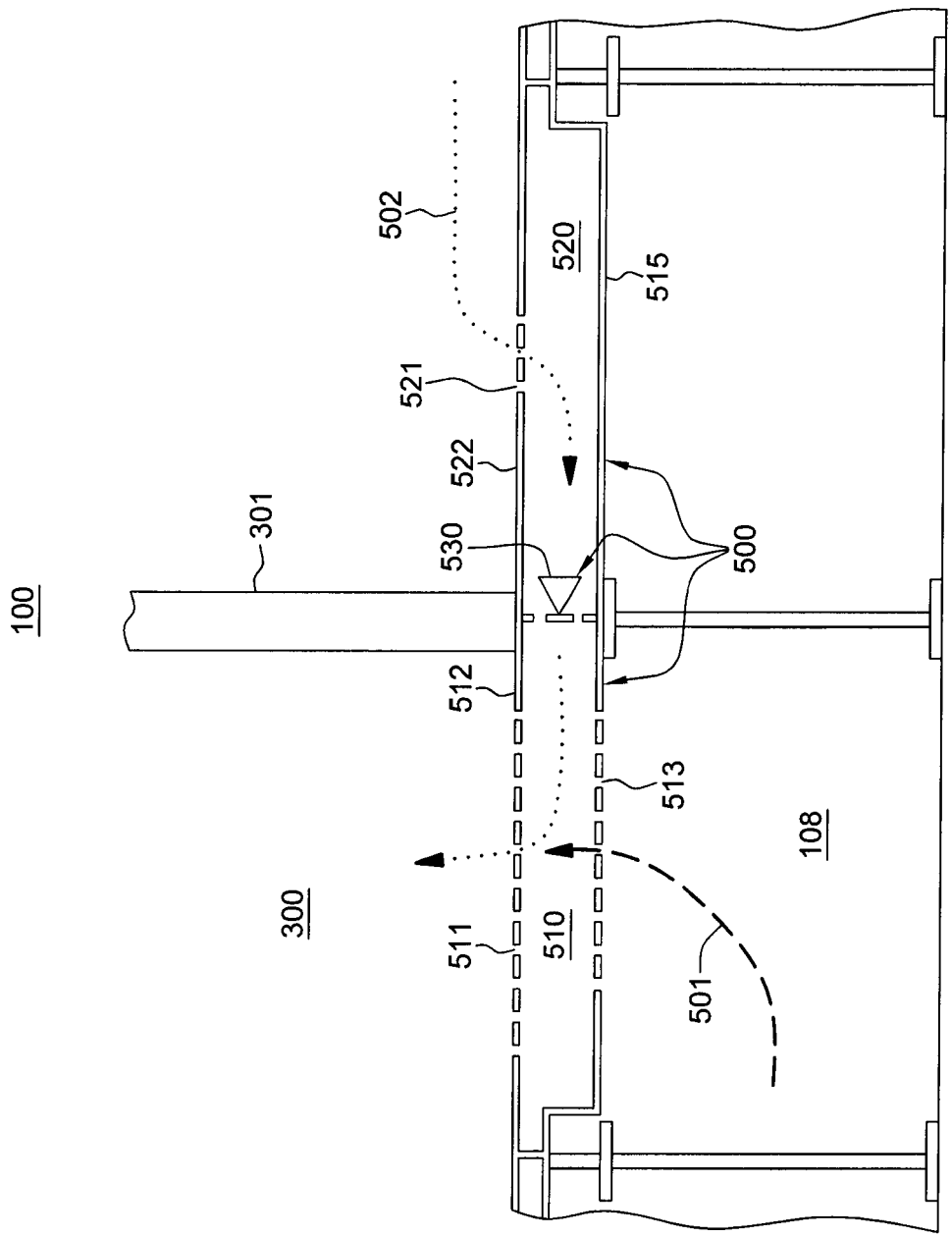
FIG. 5A is a partial schematic view of an embodiment of a raised floor data center with a tile assembly allowing failover airflow into a cold air containment aisle, in accordance with one or more aspects of the present invention.

As depicted in FIG. 5A, first tile section 510 allows, in a cold air cooling mode, cold air 501 to pass from cold air plenum 108 of data center 100 through and into cold air containment aisle 300 for supply to one or more electronics racks drawing air from the cold air containment aisle. Note that "cold air cooling mode" is used herein to refer to a normal operational air-cooling mode within the data center, wherein cold air is fed into a cold air plenum by one or more operating computer room air-conditioning (CRAC) units.

In a failover cooling mode, second tile section 520, airflow control mechanism 530, and first tile section 510 provide an air pathway for ambient air 502 within data center 100 external to cold air plenum 108, to pass through and into cold air containment aisle 300 for supply to the one or more electronics racks. Note that "failover cooling mode" refers to a cooling mode where cold air pressure has dropped within cold air plenum 108 at first tile section 510 due, for instance, to a loss of power or other fail or shut-off condition at the computer room air-conditioning unit(s) associated with the data center. Airflow control mechanism 530 disposed within the air pathway blocks cold air 501 in cold air plenum 108 from passing through second tile section 520 into data center 100 in the cold air cooling mode, and allows, in the failover cooling mode, ambient air 502 from the data center to pass through the air pathway into the cold air containment aisle 300 for supply to the one or more electronics racks. By way of example, the air pathway through second tile section 520, airflow control mechanism 530, and first tile section 510 may be a low-pressure air pathway of the failover cooling mode, and cold air 501 flows from cold air plenum 108 in the cold air cooling mode via a higher-pressure air pathway through first tile section 510 into cold air containment aisle 300. The higher-pressure air pathway would be of greater airflow resistance than the low-pressure air pathway. That is, in failover cooling mode, the air-moving devices within the electronics racks drawing air from the cold air containment aisle 300 are able to draw supplemental ambient air 502 from the data center external to the cold air plenum 108, rather than continuing to draw cold air 501 only from cold air plenum 108 with the one or more CRAC units of the data center non-operational.

Figure 5B:
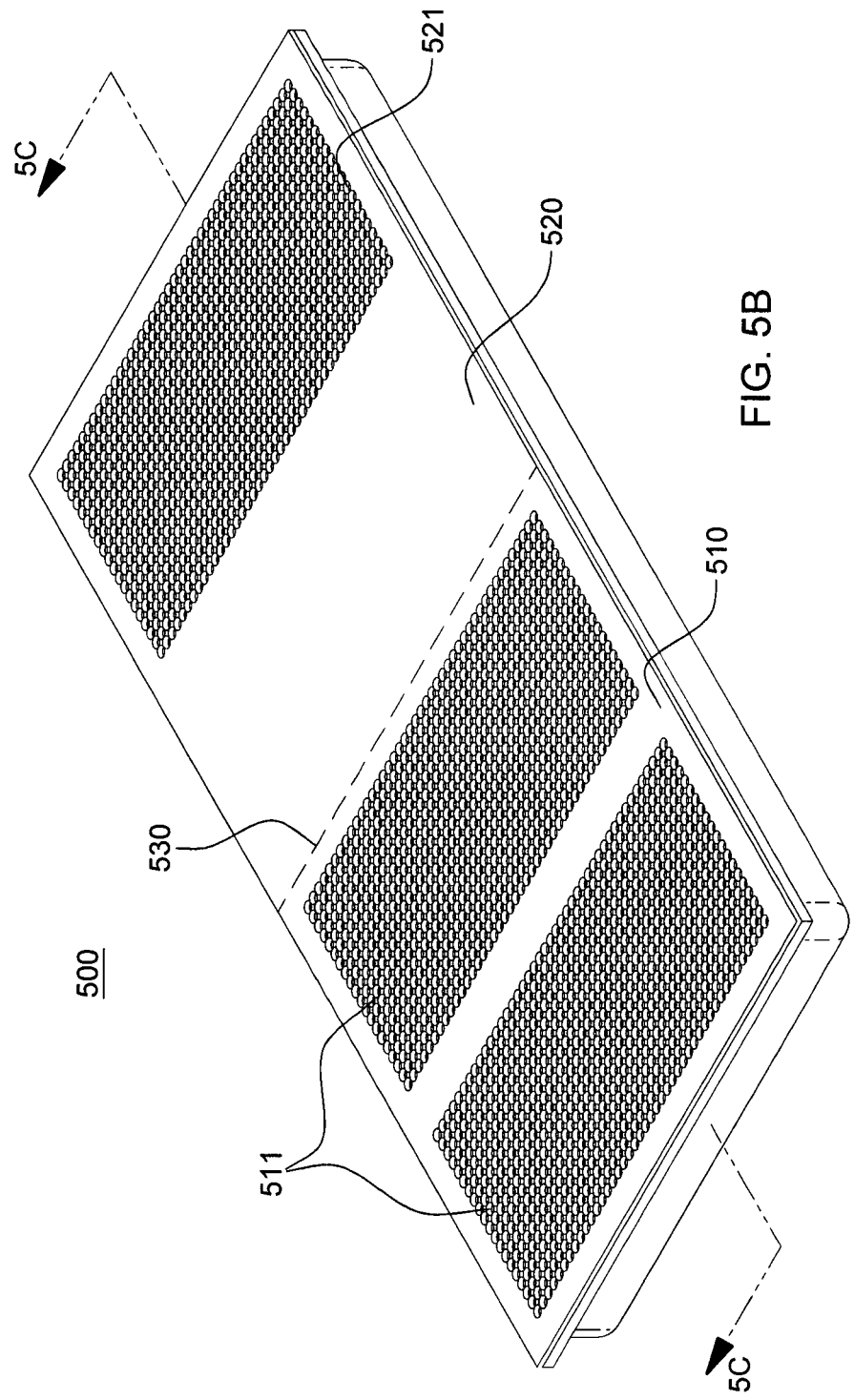
FIG. 5B depicts one detailed embodiment of a tile assembly such as depicted in FIG. 5A for a data center, in accordance with one or more aspects of the present invention.
Figure 5C:
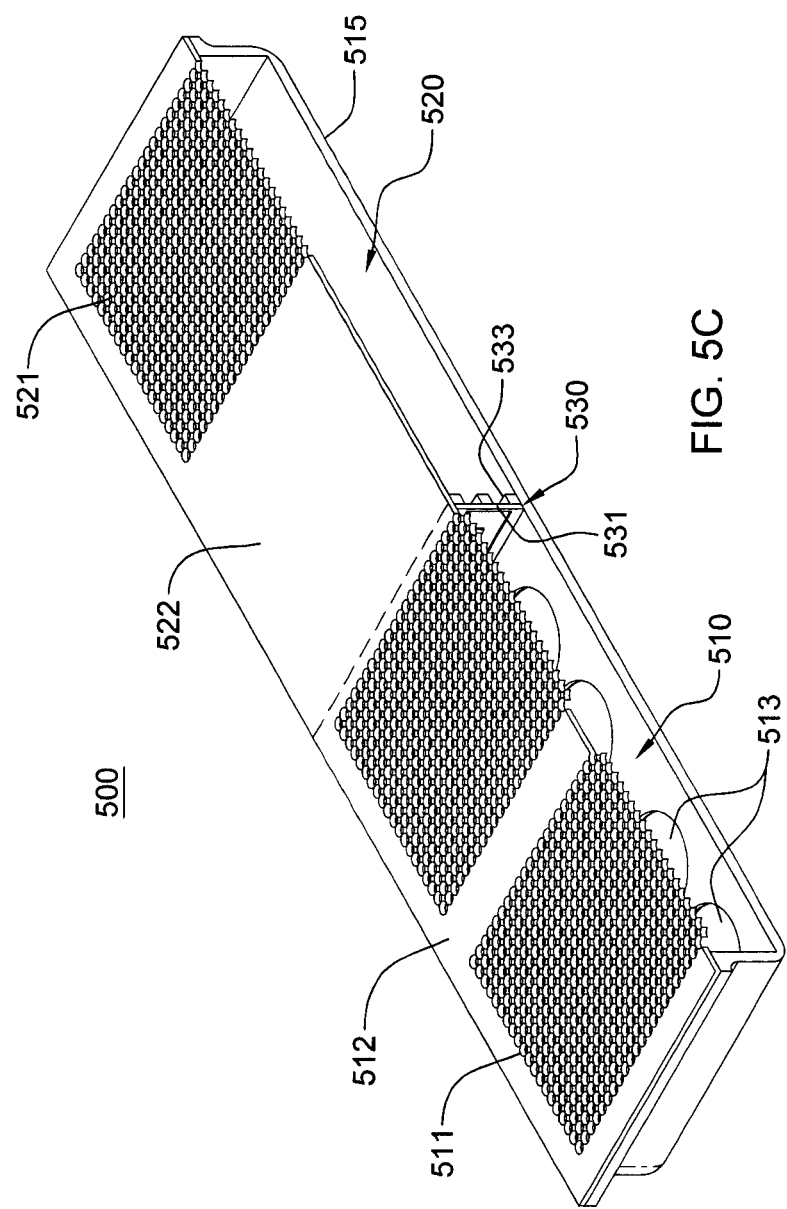
FIG. 5C is a cross-sectional view of one embodiment of the tile assembly of FIG. 5B, taken along line 5C-5C thereof, in accordance with one or more aspects of the present invention.

As depicted in FIGS. 5A-5C, first tile section 510 and second tile section 520 include respective cover tile portions 512, 522. Cover tile portions 512, 522 may be formed of a common cover tile, or may be separate tiles, depending upon the application. Tile assembly 500 further includes a base 515 (depicted in FIG. 5D), between which the pathway through first and second tile sections 510, 520 is provided. In the example depicted, first tile section 510 includes a first set of perforations 511 in cover tile portion 512, and second tile section 520 includes a second set of perforations 521 in cover tile portion 522. As depicted in FIG. 5B, the number of perforations in the first and second sets of perforations may be different. Alternatively, the size of the perforations (or openings) in the respective cover tile portions 512, 522, may be different. For instance, the second set of perforations 521 of second tile section 520 may be larger than perforations of the first set of perforations 511 in first tile section 510. As depicted in FIGS. 5A & 5C, base 515 may include one or more openings 513 within first tile section 510 which facilitate cold air flow from the cold air plenum through the first tile section into the cold air containment aisle.

Figure 5D:
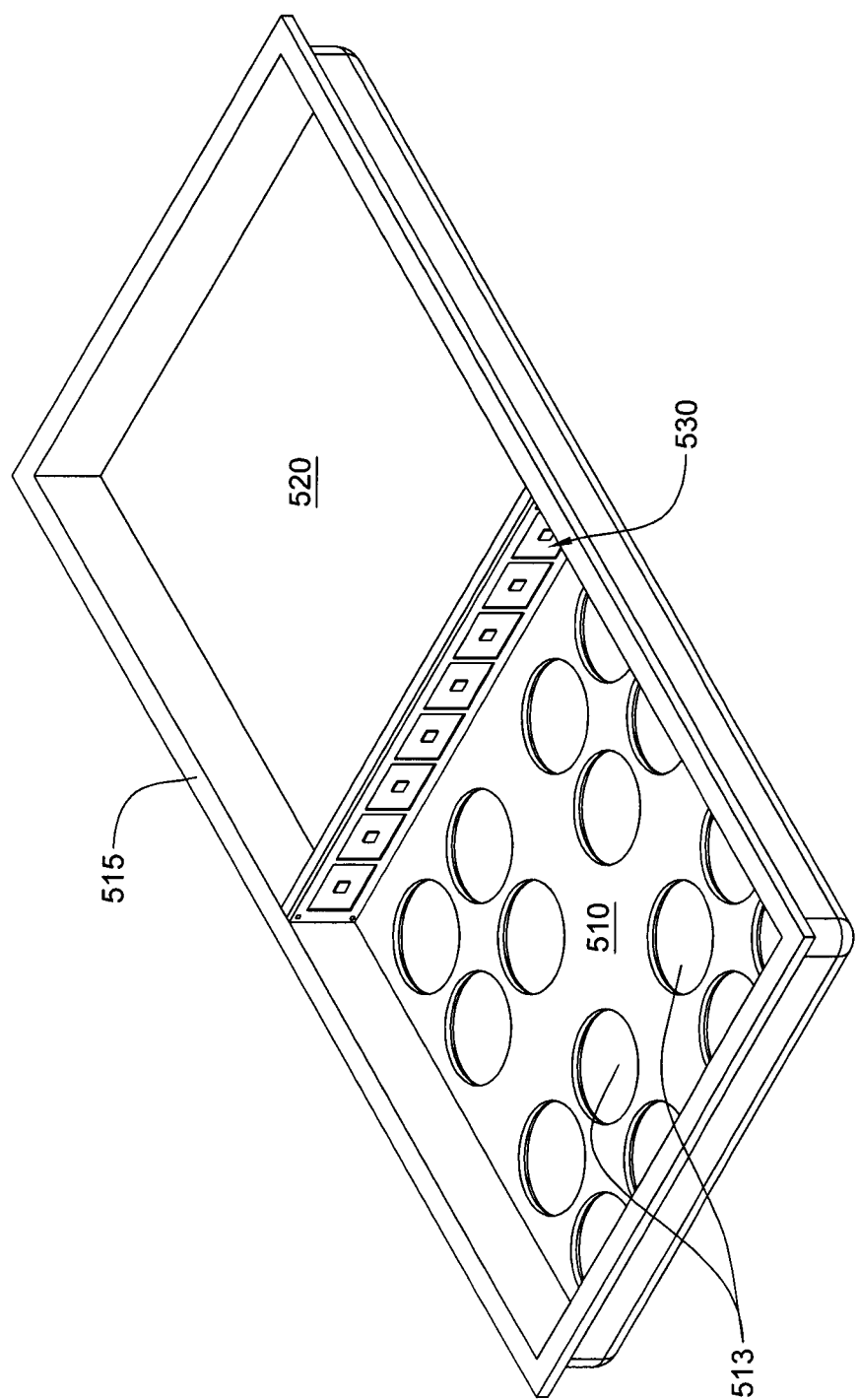
FIG. 5D is an isometric view of one embodiment of a base of the tile assembly of FIGS. 5B & 5C, in accordance with one or more aspects of the present invention.
Figure 5E:
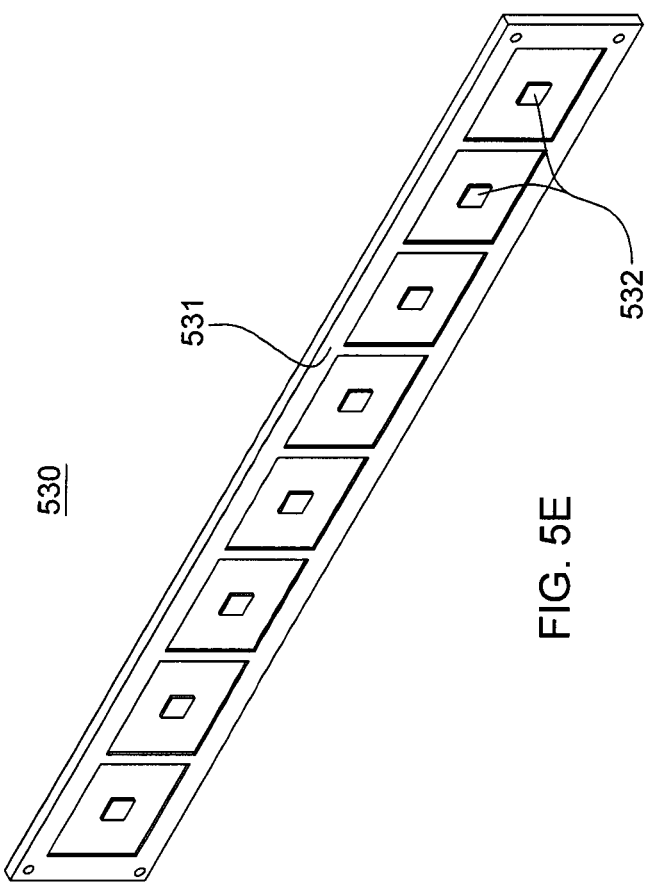
FIG. 5E depicts one embodiment of an airflow control mechanism for the tile assembly of FIGS. 5A-5D, in accordance with one or more aspects of the present invention.

FIGS. 5C-5E depict one embodiment of an airflow control mechanism 530 for a tile assembly, such as described herein. As depicted, airflow control mechanism 530 may include an airflow diode structure 531 comprising a plurality of airflow diodes 532. The airflow diode structure 531 mounts to or is associated with an airflow diode obstruction structure 533 (FIG. 5C), which includes one or more obstruction bars extending across the airflow diodes 532 to allow airflow in one direction only through the airflow diode structure 531. In particular, in the example depicted in FIGS. 5C & 5E, the airflow diode obstruction structure 533 is shown disposed on the second tile section 520 side of airflow control mechanism 530. This allows the airflow diodes 532 to open when an air pathway is established from the second tile section 520 to the first tile section 510, but not from the first tile section 510 to the second tile section 520. Thus, in the cold air cooling mode, cold air from the cold air plenum is prevented from passing through the airflow control mechanism 530 and second tile section 520 into the data center outside of the cold air containment aisle, and ambient air is allowed to pass from the data center outside the cold air containment aisle through second tile section 520 and airflow control mechanism 530 into the cold air containment aisle through first tile section 510 in the failover cooling mode. Airflow diodes 532 may be configured in a variety of forms, and are commercially available. Further details of one example of an airflow diode may be ascertained from, for instance, U.S. Pat. No. 6,174,232 B1.

Advantageously, in operation, the tile assembly allows cold air to pass from the cold air plenum through the first tile section into the cold air containment aisle due, for instance, to the higher cold air pressure at the first tile section present when the CRAC units are operating, and when not, a lower-pressure air pathway is established through the tile assembly by allowing ambient air to be drawn from the data center outside the cold air containment aisle through the second tile section 520, airflow control mechanism 530 and first tile section 510. That is, the ambient air pathway through the tile assembly is at a lower airflow resistance than the cold air pathway through the first tile section, cold air plenum, and non-operational CRAC units of the data center. Thus, the air-moving devices within the electronics racks are better able to draw air into the racks in the failover cooling mode.

FIGS. 6A-6E depict another embodiment of a data center 100' comprising a tile assembly, generally denoted 600, in accordance with one or more aspects of the present invention. Tile assembly 600 may be or include, in one or more implementations, an assembly of separate tiles, or a common tile structure. The tile assembly includes a first tile section 610, second tile section 620, and an airflow control mechanism 630.

Figure 6A:
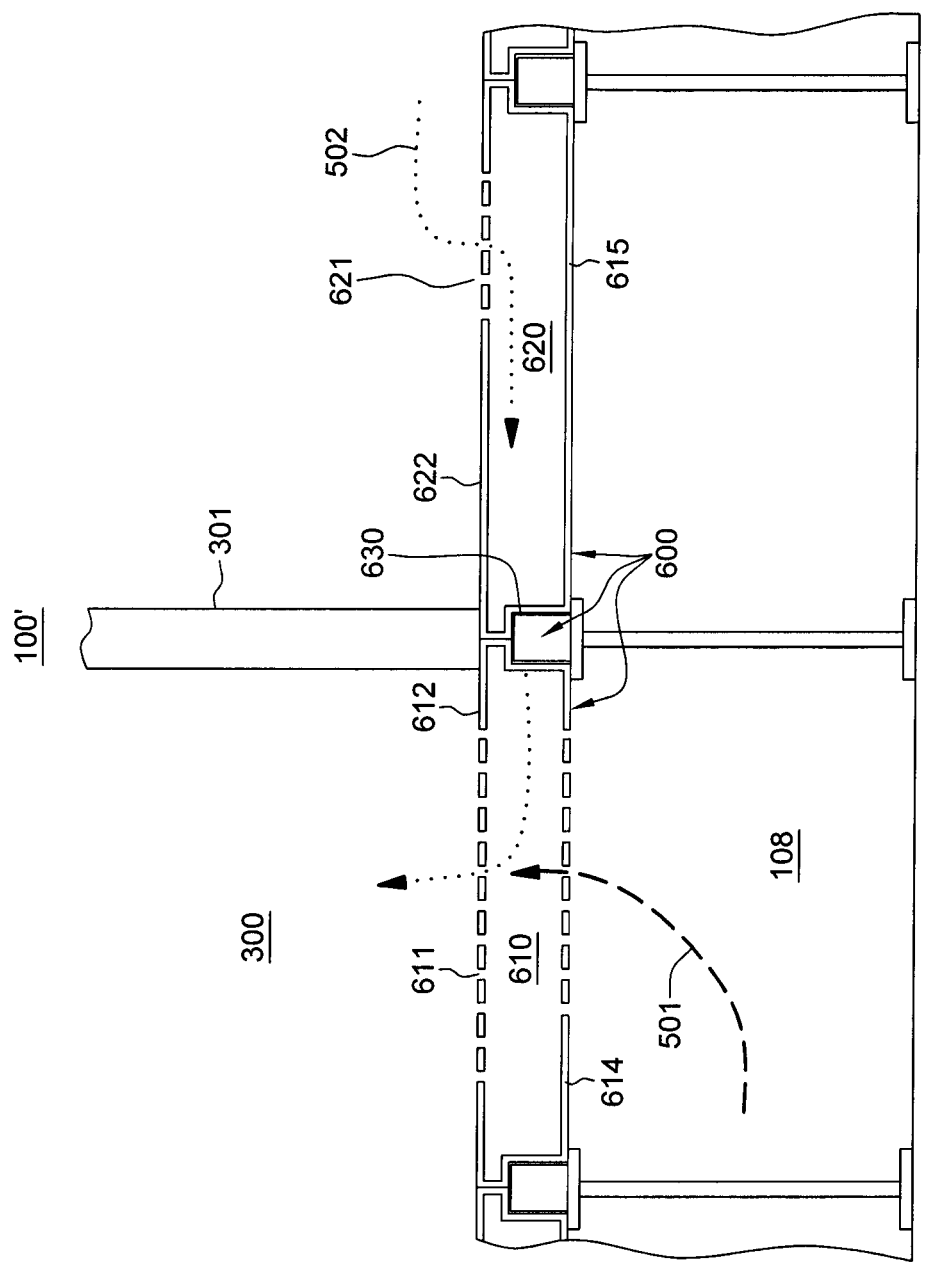
FIG. 6A is a partial schematic depiction of an alternate embodiment of a tile assembly for a raised floor data center, which allows failover airflow into a cold air containment aisle of the data center, in accordance with one or more aspects of the present invention.

As shown in FIG. 6A, tile assembly 600 may be positioned so that first tile section 610 resides, or is exposed to, cold air containment aisle 300 of data center 100', and second tile section 620 resides, at least in part, external to cold air containment aisle 300 within data center 100'. As noted above, cold air containment aisle 300 may be formed using one or more containment panels 301 disposed, for instance, at the end of a cold air aisle of data center 100'.

In one or more embodiments, first tile section 610 allows, in a cold air cooling mode, cold air 501 to pass from cold air plenum 108 of data center 100' through and into cold air containment aisle 300 for supply to one or more electronic components drawing air from the cold air containment aisle. In a failover cooling mode, second tile section 620, airflow control mechanism 630, and first tile section 610, provide an air pathway for ambient air 502 within data center 100' external to cold air plenum 108 to pass through and into cold air containment aisle 300 for supply to the one or more electronics racks.

In operation, airflow control mechanism 630 disposed within the air pathway blocks cold air 501 in cold air plenum 108 from passing from first tile section 610 through second tile section 620 into data center 100' in the cold air cooling mode, and allows, in the failover cooling mode, ambient air 502 from the data center to pass through the air pathway into the cold air containment aisle 300 for supply to the one or more electronics racks. By way of example, the air pathway through second tile section 620, airflow control mechanism 630, and first tile section 610 may be a low-resistance air pathway of the failover cooling mode, and cold air 501 flows from cold air plenum 108 in the cold air cooling mode via a higher-resistance pathway through first tile section 610 into cold air containment aisle 300. The higher-resistance air pathway would be of greater resistance than the low-resistance air pathway. That is, in failover cooling mode, the air-moving devices within the electronics racks drawing air from the cold air containment aisle 300 are able to more easily draw ambient air 502 from the data center external to the cold air plenum 108, than continuing to draw cold air 501 from only cold air plenum 108 with the one or more CRAC units of the data center non-operational.

Figure 6B:
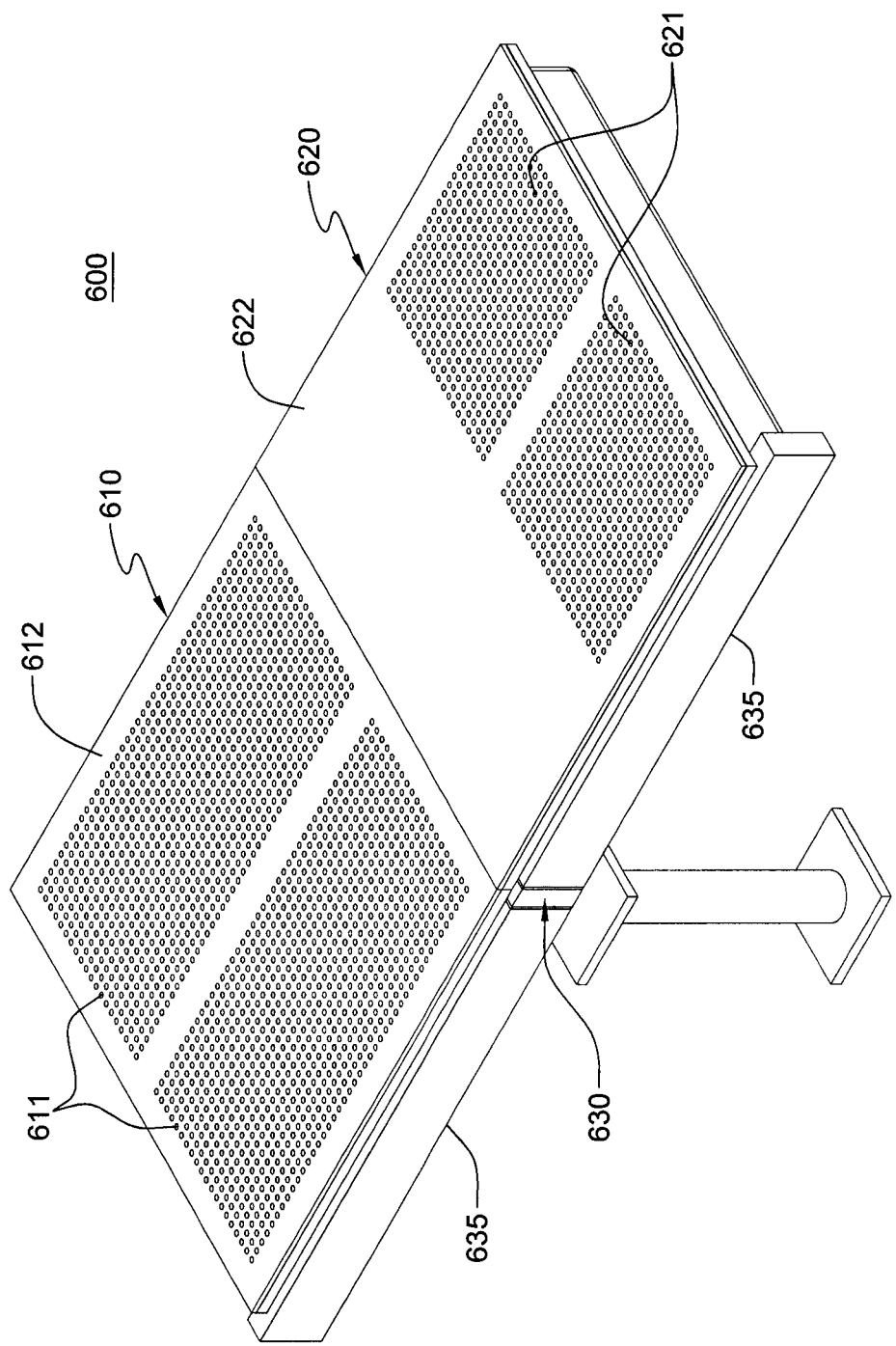
FIG. 6B depicts one detailed embodiment of a tile assembly such as depicted in FIG. 6A for a data center, in accordance with one or more aspects of the present invention.
Figure 6C:
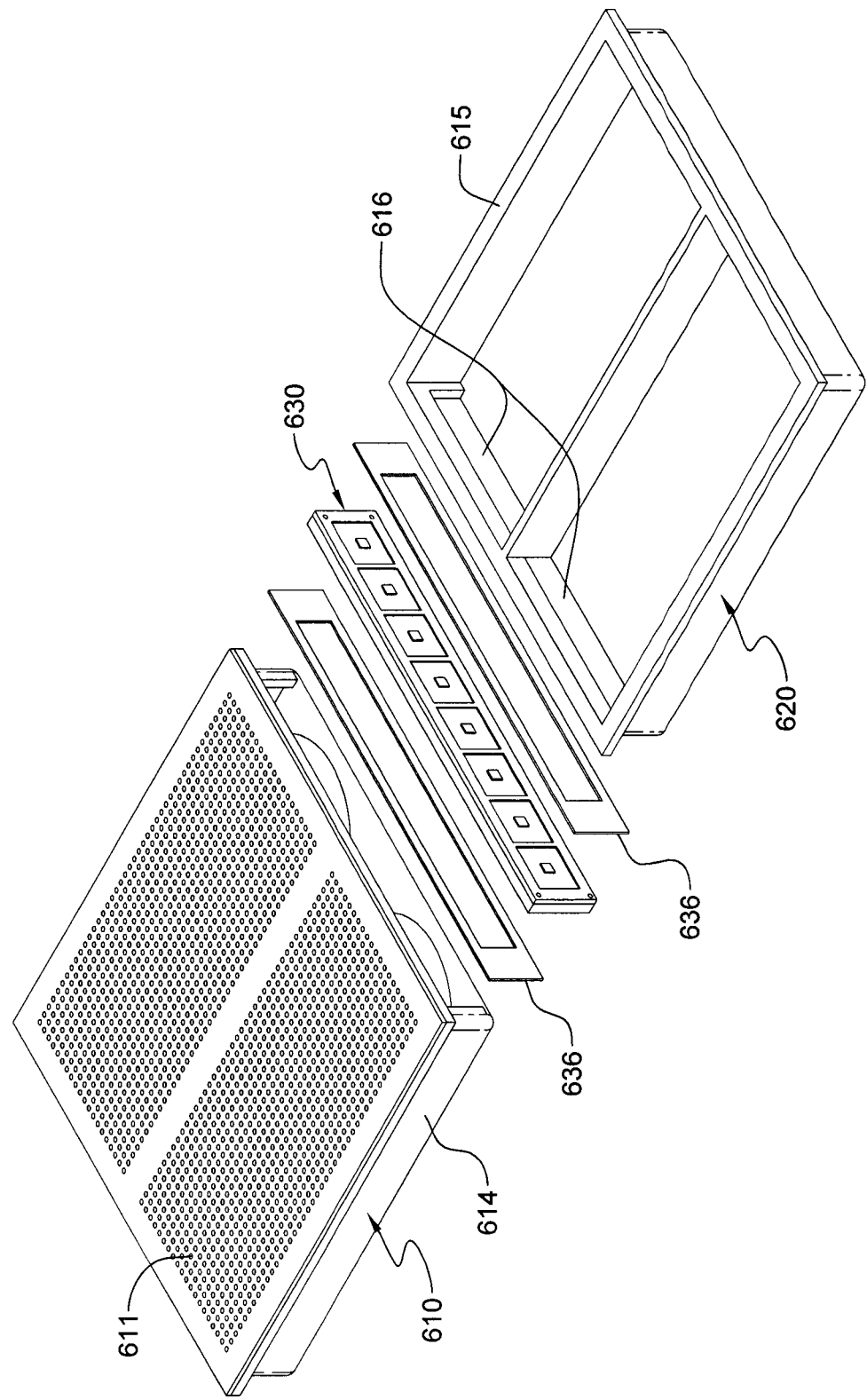
FIG. 6C is a partially exploded depiction of the tile assembly of FIG. 6B, with the cover tile of a portion of the tile assembly removed, in accordance with one or more aspects of the present invention.

As depicted in FIGS. 6A-6C, first tile section 610 and second tile section 620 are supported by one or more support bars 635, and include respective cover tile portions 612, 622. Cover tile portions 612, 622 may be formed of a common cover tile, or may be separate tiles, depending upon the application. In the embodiment of FIGS. 6A-6C, tile assembly 600 is shown to comprise separate tiles, including separate cover tiles. Further, as depicted in FIGS. 6A & 6C, each tile section 610, 620 includes a respective base 614, 615 which, together with the cover tile portions 612, 622, define the space through which the cold air 501 and/or ambient air 502 flows. In the example depicted, first tile section 610 includes a first set of perforations 611 in cover tile portion 612, and second tile section 620 includes a second set of perforations 621 in cover tile portion 622. As depicted in FIG. 6B, the number of perforations in the first and second sets of perforations may be different. Alternatively, the size of the perforations (or openings) in the respective tile portions 612, 622, may be different. For instance, second set of perforations 621 of second tile section 620 may be larger than the first set of perforations 611 in first tile section 610. As depicted in FIG. 6A, base 614 of first tile section 610 may include openings in fluid communication with cold air plenum 108 which facilitate cold air flow from the cold air plenum being drawing into and through first tile section 610 to cold air containment aisle 300.

As depicted in FIG. 6C, airflow control mechanism 630 may be, in one or more implementations, a support bar with the airflow control mechanism integrated within the support bar. In this implementation, gaskets 636 on either side of airflow control mechanism 630 may be provided to facilitate sealing first tile section 610 and second tile section 620 against opposite sides of airflow control mechanism 630. In one or more implementations, the support bar may be employed as part of the support for the raised floor of the data center. Note that openings 616 may be provided in base 614 of both first tile section 610 and base 615 of second tile section 620 to allow, for instance, the ambient air 502 (FIG. 6A) to pass through the tile sections and airflow control mechanism 630 in the failover cooling mode, as described herein.

Figures 6D, 6E:
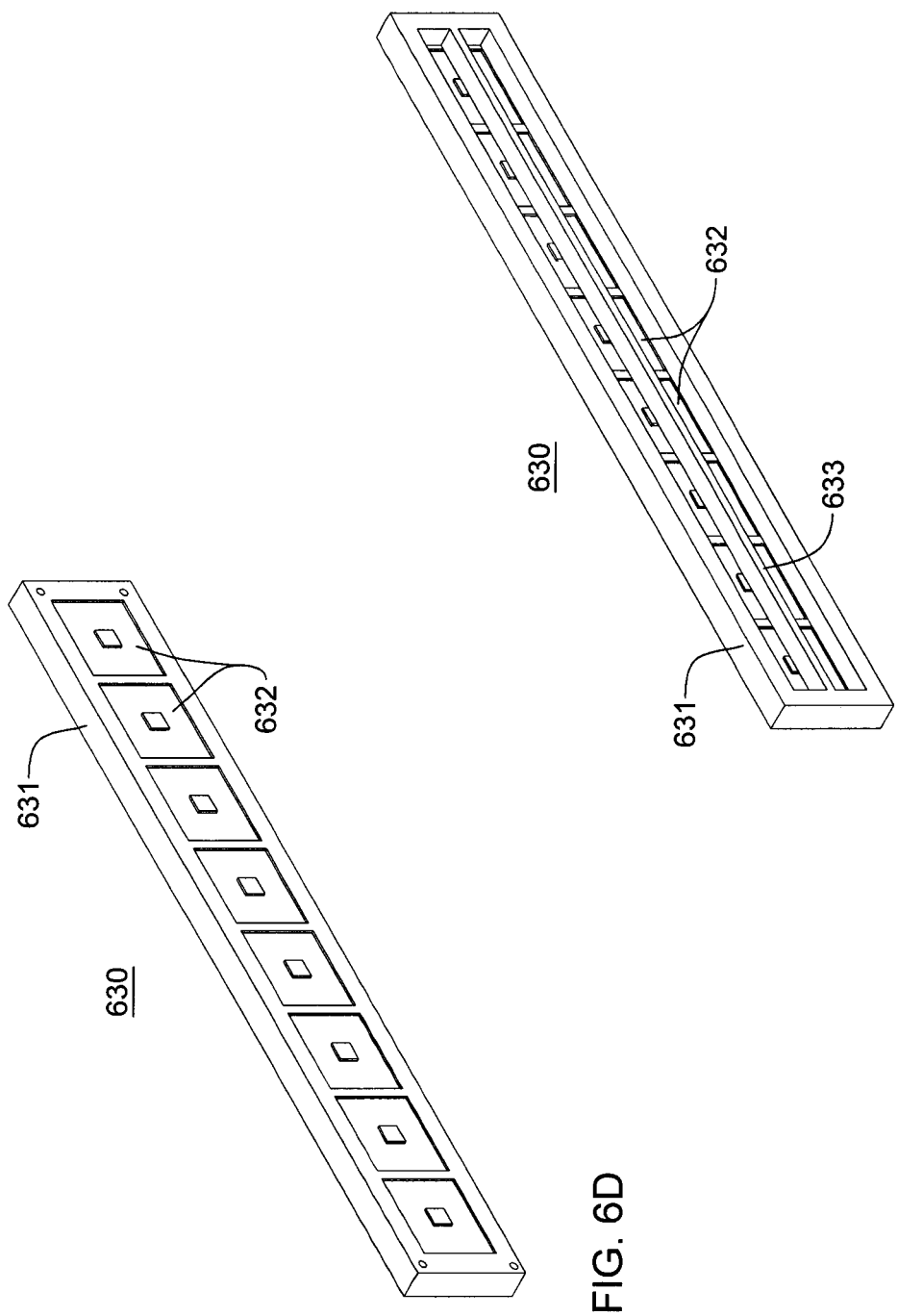
FIG. 6D depicts a front isometric view of one embodiment of a support bar with integral airflow diodes for a tile assembly such as depicted in FIGS. 6A-6C, in accordance with one or more aspects of the present invention.
FIG. 6E depicts a back isometric view of the support bar with integral airflow diodes of FIG. 6D, in accordance with one or more aspects of the present invention.

FIGS. 6C-6E depict one embodiment of airflow control mechanism 630 for tile assembly 600. As depicted, airflow control mechanism 630 may be an integrated support bar and air diode structure 631 comprising a plurality of airflow diodes 632. The integrated support bar and airflow diode structure 631 may be disposed as depicted, for instance, in FIGS. 6A & 6B, between first tile section 610 and second tile section 620, which in the depicted example, may be two or more separate tiles of the data center. Note in this regard, that any number of second tile sections 620 could be integrated with one or more first tile sections 610 so as to, for instance, further lower the pressure drop for drawing ambient air 502 from data center 100' external to cold air plenum 108 when in the failover cooling mode.

Note with reference to FIGS. 6D & 6E, that airflow diodes 632 are set within respective openings formed within support bar structure 631, and an airflow diode obstruction 633 is provided, in the depicted example, on the second tile section 620 side of the tile assembly. This allows the airflow diode 632 to open to establish the air pathway from second tile section 620 to first tile section 610, but blocks airflow from first tile section 610 back through the airflow control mechanism to second tile section 620. Thus, in the cold air cooling mode, cold air from the cold air plenum is prevented from passing through airflow control mechanism 630 and second tile section 620 into the data center outside of the cold air containment aisle, and in the failover cooling mode, ambient air is allowed to pass from the data center outside the cold air containment aisle through second tile section 620 and airflow control mechanism 630 into the cold air containment aisle through first tile section 610.

Figure 7C:
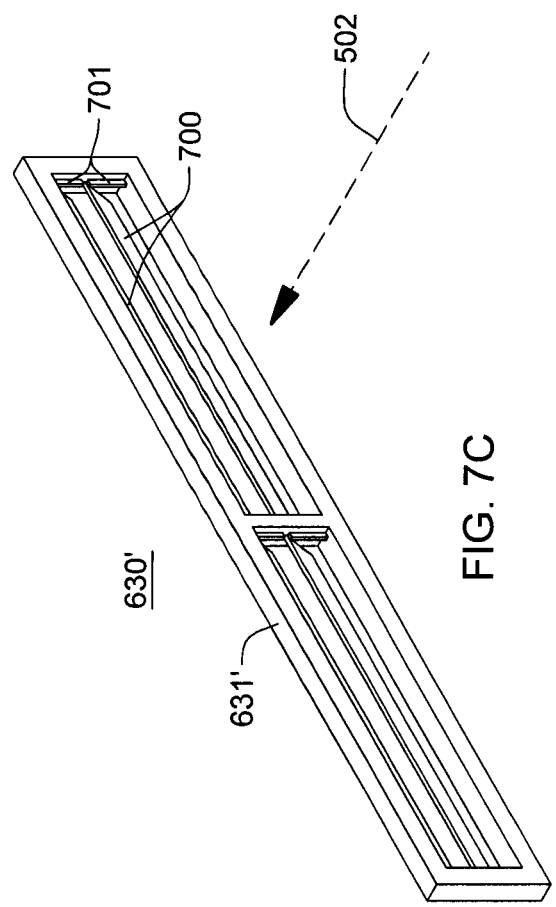
FIG. 7C depicts the support bar with integral louvers of FIGS. 7A & 7B, with the louvers shown open to allow failover airflow into the cold air containment aisle, in accordance with one or more aspects of the present invention.

FIGS. 7A-7C depict an alternate embodiment of an airflow control mechanism 630', which comprises an integrated support bar and louver structure 631', in accordance with one or more aspects of the present invention. In this embodiment, the airflow diodes of FIGS. 6D & 6E are replaced with one or more louvers 700 disposed within respective openings in the support bar. Louver obstructions 701 are provided on the second tile section side of the support bar to allow airflow in one direction only through louvers 700. In particular, in the example depicted in FIGS. 7A-7C, the louver obstructions 701 are shown disposed so that louver 700 may open to establish an air pathway from the second tile section to the first tile section, but not from the first to the second. Thus, in the cold air cooling mode, cold air from the cold air plenum is prevented from passing through airflow control mechanism 630' into the second tile section to the data center outside of the cold air containment aisle, and in the failover cooling mode, ambient air is allowed to pass from the data center outside the cold air containment aisle through the second tile section, airflow control mechanism, and first tile section into the cold air containment aisle.

Figure 8:
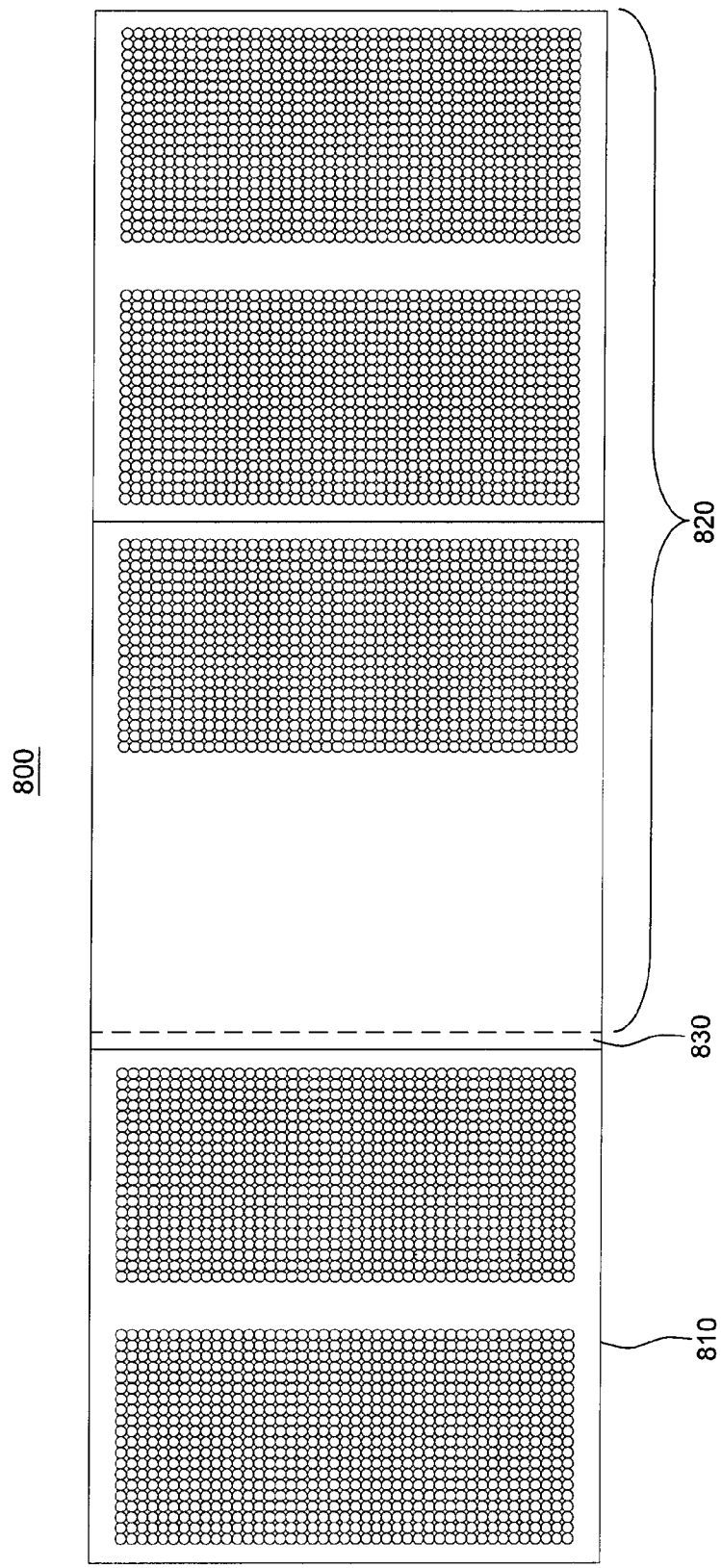
FIG. 8 is a schematic depiction of an alternate embodiment of a tile assembly facilitating failover airflow into a cold air containment aisle of a data center, in accordance with one or more aspects of the present invention.

By way of further explanation, FIG. 8 depicts a schematic plan view of a tile assembly 800 for a data center, such as described above. In this configuration, tile assembly 800 includes a first tile section 810, second tile section 820, and airflow control mechanism 830 disposed between first tile section 810 and second tile section 820 in a manner similar to that described above in connection with FIGS. 5A-7C. As depicted in FIG. 8, second tile section 820 may be larger than first tile section 810, and include a greater number of perforations to facilitate the electronics racks drawing ambient air from external the cold air plenum in the failover cooling mode through the tile assembly. Any configuration of the common tile structure or multiple adjacent tile structures described above could be employed to draw air from the data center outside of the cold air containment aisle, through the tile assembly, and into and through first tile section 810 in the failover cooling mode, as described.

Those skilled in the art should also note from the description provided herein that the tile assembly disclosed could alternatively be employed as part of a ceiling tile assembly in a data center configuration having an overhead cold air plenum feeding cold air to a cold air containment aisle.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
    a tile assembly for a data center, the tile assembly comprising:
        a first tile section to allow, in a cold air cooling mode, cold air from a cold air plenum of the data center to flow through the first tile section to a cold air containment aisle of the data center for supply to one or more electronics racks drawing air from the cold air containment aisle;
        a second tile section associated with the first tile section to allow, in a failover cooling mode, ambient air of the data center external to the cold air plenum to flow, via an air pathway external to the cold air plenum, through the second tile section and the first tile section of the tile assembly, into the cold air containment aisle; and
        an airflow control mechanism disposed within the air pathway to block cold air from the cold air plenum from passing through the second tile section into the data center in the cold air cooling mode, and to allow, in the failover cooling mode, ambient air from the data center to pass through the air pathway into the cold air containment aisle for supply to the one or more electronics racks.

2. The apparatus of claim 1, wherein the first tile section and the second tile section are different portions of a common tile structure.

3. The apparatus of claim 2, wherein the first tile section comprises a first set of perforations through which air passes into the cold air containment aisle in both the cold air cooling mode and the failover cooling mode, and the second tile section comprises a second set of perforations through which ambient air from the data center enters the air pathway of the tile assembly in the failover cooling mode.

4. The apparatus of claim 3, wherein the first set of perforations are different in at least one of quantity or size from the second set of perforations.

5. The apparatus of claim 2, wherein the first tile section is in fluid communication with the cold air plenum via one or more openings in a base of the common tile structure, the one or more openings in the base facilitating, in the cold air cooling mode, the flow of cold air from the cold air plenum through the first tile section into the cold air containment aisle.

6. The apparatus of claim 1, wherein the airflow control mechanism comprises at least one airflow diode or at least one louver, the airflow control mechanism automatically opening to allow the ambient air of the data center external to the cold air plenum to pass through the air pathway in the failover cooling mode based on a drop in cold air pressure at the first tile section.

7. The apparatus of claim 1, wherein the tile assembly is sized to allow the first tile section to reside, at least in part, within the cold air aisle containment aisle, and the second tile section to reside, at least in part, external to the cold aisle containment aisle.

8. The apparatus of claim 1, wherein the air pathway through the second tile section and the first tile section is a low-pressure air pathway in the failover cooling mode, and wherein the cold air flows from the cold air plenum via a high-pressure air pathway through the first tile section into the cold air containment aisle in the cold air cooling mode, the high-pressure air pathway being of greater pressure than the low-pressure air pathway.

9. The apparatus of claim 1, wherein the air pathway is through an opening in a support bar associated with the tile assembly, the airflow control mechanism being disposed, at least in part, within the opening in the support bar, and the support bar being disposed between and dividing the first tile section and the second tile section.

10. The apparatus of claim 1, wherein the second tile section is larger than the first tile section.

11. The apparatus of claim 1, wherein the second tile section comprises a greater number of tiles than the first tile section.

12. A data center comprising:
    at least one electronics rack to be cooled, the at least one electronics rack drawing air from a cold air containment aisle of the data center; and a tile assembly, the tile assembly comprising:
- a first tile section to allow, in a cold air cooling mode, cold air from a cold air plenum of the data center to flow through the first tile section to the cold air containment aisle for supply to the at least one electronics rack;
- a second tile section associated with the first tile section to allow, in a failover cooling mode, ambient air of the data center external to the cold air plenum to flow, via an air pathway external to the cold air plenum, through the second tile section and the first tile section of the tile assembly, into the cold air containment aisle; and
- an airflow control mechanism disposed within the air pathway to block cold air from the cold air plenum from passing through the second tile section into the data center in the cold air cooling mode, and to allow, in the failover cooling mode, ambient air of the data center to pass through the air pathway into the cold air containment aisle for supply to the at least one electronics rack.

13. The data center of claim 12, wherein the first tile section comprises a first set of perforations through which air passes into the cold air containment aisle in both the cold air cooling mode and the failover cooling mode, and the second tile section comprises a second set of perforations through which ambient air from the data center enters the air pathway of the tile assembly in the failover cooling mode.

14. The data center of claim 12, wherein the airflow control mechanism comprises at least one airflow diode or at least one louver, the airflow control mechanism automatically opening to allow the ambient air of the data center external to the cold air plenum to pass through the air pathway in the failover cooling mode based on a drop in cold air pressure at the first tile section.

15. The data center of claim 12, wherein the tile assembly is sized to allow the first tile section to reside, at least in part, within the cold air aisle containment aisle, and the second tile section to reside, at least in part, external to the cold aisle containment aisle.

16. The data center of claim 12, wherein the air pathway through the second tile section and the first tile section is a low-pressure air pathway in the failover cooling mode, and wherein the cold air flows from the cold air plenum via a high-pressure air pathway through the first tile section into the cold air containment aisle in the cold air cooling mode, the high-pressure air pathway being of greater pressure than the low-pressure air pathway.

17. The data center of claim 12, wherein the air pathway is through an opening in a support bar associated with the tile assembly, the airflow control mechanism being disposed, at least in part, within the opening in the support bar, and the support bar being disposed between and dividing the first tile section and the second tile section.

18. The data center of claim 12, wherein the second tile section is larger than the first tile section.

19. The data center of claim 12, wherein the second tile section comprises a greater number of tiles than the first tile section.

20. A method of facilitating cooling, the method comprising:
- providing a tile assembly for a data center comprising at least one electronics rack to be cooled, the providing the tile assembly comprising:
  - providing a first tile section to allow, in a cold air cooling mode, cold air from a cold air plenum of the data center to flow through the first tile section to a cold air containment aisle of the data center for supply to the at least one electronics rack, which is disposed to draw air from the cold air containment aisle;
  - providing a second tile section associated with the first tile section to allow, in a failover cooling mode, ambient air from the data center external to the cold air plenum to flow, via an air pathway external to the cold air plenum, through the second tile section and the first tile section of the tile assembly, into the cold air containment aisle; and
  - providing an airflow control mechanism disposed within the air pathway to block cold air from the cold air plenum from passing through the second tile section into the data center in the cold air cooling mode, and to allow, in the failover cooling mode, ambient air from the data center to pass through the air pathway into the cold air containment aisle for supply to the one or more electronics racks.

* * * * *